United States Patent
Jeon et al.

(10) Patent No.: US 7,399,670 B2
(45) Date of Patent: Jul. 15, 2008

(54) METHODS OF FORMING DIFFERENT GATE STRUCTURES IN NMOS AND PMOS REGIONS AND GATE STRUCTURES SO FORMED

(75) Inventors: Taek-Soo Jeon, Gyeonggi (KR); Yu-Gyun Shin, Gyeonggi-do (KR); Sang-Bom Kang, Seoul (KR); Hong-Bae Park, Seoul (KR); Hag-Ju Cho, Seoul (KR); Hye-Lan Lee, Gyeonggi-do (KR); Beom-Jun Jin, Seoul (KR); Seong-Geon Park, Gyeonggi-do (KR)

(73) Assignee: Samsung Electronics Co., Ltd, Gyeonggi-do (KR)

( * ) Notice: Subject to any disclaimer, the term of this patent is extended or adjusted under 35 U.S.C. 154(b) by 380 days.

(21) Appl. No.: 11/183,651

(22) Filed: Jul. 18, 2005

(65) Prior Publication Data

US 2006/0030097 A1 Feb. 9, 2006

(30) Foreign Application Priority Data

Aug. 9, 2004 (KR) ...................... 10-2004-0062640

(51) Int. Cl.
*H01L 21/8238* (2006.01)
*H01L 21/8234* (2006.01)
*H01L 21/3205* (2006.01)
*H01L 21/4763* (2006.01)

(52) U.S. Cl. ...................... 438/232; 438/592; 438/197; 257/E21.13; 257/E21.2; 257/E21.203

(58) Field of Classification Search ................ 438/232, 438/197, 239, 592, 583; 257/E21.13, E21.164, 257/E21.165, E21.168, E21.199, E21.2, E21.203
See application file for complete search history.

(56) References Cited

U.S. PATENT DOCUMENTS

| 5,567,642 | A | * | 10/1996 | Kim et al. .................... 438/232 |
| 7,109,077 | B2 | | 9/2006 | Rotondaro et al. |
| 7,195,969 | B2 | * | 3/2007 | Chan et al. ................... 438/230 |
| 2005/0037557 | A1 | * | 2/2005 | Doczy et al. ................. 438/197 |
| 2005/0067704 | A1 | * | 3/2005 | Kaneko et al. .............. 257/758 |
| 2006/0024882 | A1 | * | 2/2006 | Lu et al. ..................... 438/239 |
| 2006/0115940 | A1 | * | 6/2006 | Kim et al. ................... 438/197 |

FOREIGN PATENT DOCUMENTS

| JP | 2000-252370 | 9/2000 |
| KR | 1020040034087 | 4/2004 |

OTHER PUBLICATIONS

Korean Office Action for Korean Application No. 10-2004-0062640; dated Jan. 19, 2006.

* cited by examiner

*Primary Examiner*—Walter L Lindsay, Jr.
(74) *Attorney, Agent, or Firm*—Myers Bigel Sibley & Sajovec, P.A.

(57) ABSTRACT

A method of forming transistor gate structures in an integrated circuit device can include forming a high-k gate insulating layer on a substrate including a first region to include PMOS transistors and a second region to include NMOS transistors. A polysilicon gate layer can be formed on the high-k gate insulating layer in the first and second regions. A metal silicide gate layer can be formed directly on the high-k gate insulating layer in the first region and avoiding forming the metal-silicide in the second region. Related gate structures are also disclosed.

19 Claims, 5 Drawing Sheets

METHODS OF FORMING DIFFERENT GATE STRUCTURES IN NMOS AND PMOS REGIONS AND GATE STRUCTURES SO FORMED

CROSS-REFERENCE TO RELATED APPLICATION

This application claims the benefit of Korean Patent Application No. 2004-62640, filed on Aug. 9, 2004, the contents of which are hereby incorporated herein by reference in their entirety.

FIELD OF THE INVENTION

The present invention relates to methods of forming PMOS and NMOS devices in a semiconductor device and more devices so formed.

BACKGROUND

In order to reduce leakage current due to decreased thickness of a gate dielectric layer, a layer having a high-k dielectric constant may be used. Accordingly, a hafnium-based insulating layer, such as a hafnium oxide layer or a hafnium silicon oxide layer, can be used. However, if a hafnium-based insulating layer is used with a polysilicon gate electrode, the bonding between the hafnium-based oxide layer and the polysilicon layer can be inadequate so that a Fermi level pinning phenomenon can affect the work function of the gate electrode, which can lead to an increase in the threshold voltage Vth of the device. Moreover, the increase of the threshold voltage in a P-type metal oxide semiconductor (PMOS) transistor region may become significantly more than the threshold voltage of an N-type metal oxide semiconductor (NMOS) transistor in the same device.

A method of fabricating an integrated circuit having a dual-gate structure is discussed in U.S. Pat. No. 5,567,642 ('642) entitled Method of fabricating gate electrode of CMOS device. According to the '642 patent, a gate electrode including a polysilicon layer and a silicide pattern is disposed in the PMOS transistor region, whereas and a gate electrode of an NMOS transistor (in the NMOS region) is polysilicon.

SUMMARY

Embodiments according to the invention may provide methods of forming different gate structures in NMOS and PMOS regions and gate structures so formed. Pursuant to these embodiments, a method of forming transistor gate structures in an integrated circuit device can include forming a high-k gate insulating layer on a substrate including a first region to include PMOS transistors and a second region to include NMOS transistors. A polysilicon gate layer can be formed on the high-k gate insulating layer in the first and second regions. A metal silicide gate layer can be formed directly on the high-k gate insulating layer in the first region and avoiding forming the metal-silicide in the second region.

In some embodiments according to the invention, forming a polysilicon gate layer can include forming the polysilicon gate layer directly on the high-k gate insulating layer. In some embodiments according to the invention, forming a metal silicide gate layer includes forming a polysilicon layer directly on the high-k gate insulating layer. A lower metal layer can be formed on the polysilicon gate layer in the first region. The lower metal layer and the polysilicon can be annealed to form the metal silicide gate layer.

In some embodiments according to the invention, the method also includes forming the polysilicon gate layer directly on the high-k gate insulating layer in the first and second regions. A mask pattern is formed on the polysilicon gate layer that covers the polysilicon gate layer in the second region and exposes the polysilicon gate layer in the first region. The polysilicon gate layer is recessed in the first region to form a reduced thickness polysilicon gate layer that is thinner than a thickness of the polysilicon gate layer covered by the mask pattern.

In some embodiments according to the invention, the method further includes forming the lower metal layer on the reduced thickness polysilicon gate layer and on the mask pattern. The lower metal layer on the reduced thickness polysilicon gate layer is annealed to form the metal silicide gate layer in the first region. Any unreacted portion of the lower metal layer is removed.

In some embodiments according to the invention, the method further includes removing the mask pattern from polysilicon gate layer in the second region. The metal silicide gate layer and the polysilicon gate layer are planarized. A photoresist pattern is formed on the polysilicon gate layer in the second region. Ions are implanted into the metal silicide gate layer using the photoresist pattern as a mask to adjust a work function associated with the metal silicide gate layer.

In some embodiments according to the invention, the method further includes removing the photoresist pattern and forming an upper metal layer on the metal silicide gate layer and on the polysilicon gate layer. The upper metal layer is planarized to form a first gate structure of a PMOS transistor in the first region including the metal silicide gate layer directly on the high-k gate insulating layer and to form a second gate structure of an NMOS transistor in the second region including the polysilicon gate layer directly on the high-k gate insulating layer.

In some embodiments according to the invention, the lower metal layer is a cobalt layer, a nickel layer, a hafnium layer, a tungsten layer, and/or a tantalum layer. In some embodiments according to the invention, the upper metal layer is a cobalt layer, a nickel layer, a hafnium layer, a tungsten layer, and/or a tantalum layer. In some embodiments according to the invention, the gate insulating layer is $HfO_2$, HfSiO, HfON, and/or HFSiON.

In further embodiments according to the invention, an integrated circuit with an NMOS region and a PMOS region includes a high-k gate insulating layer on a substrate including on a first region to include PMOS transistors and on a second region to include NMOS transistors. A polysilicon gate layer is directly on the high-k gate insulating layer in the second region. A metal silicide gate layer is directly on the high-k gate insulating layer in the first region.

DESCRIPTION EMBODIMENTS ACCORDING TO THE INVENTION

The invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower", "bottom", "upper", "top", "beneath", "above", and the like are used herein to describe one element's relationship to another elements as illustrated in the Figures. It will be understood that relative terms are intended to encompass different orientations of the subject in the figures in addition to the orientation depicted in the Figures. For example, if the subject in the Figures is turned over, elements described as being on the "lower" side of or "below" other elements would then be oriented on "upper" sides of (or "above") the other elements. The exemplary term "lower", can therefore, encompasses both an orientation of "lower" and "upper," depending of the particular orientation of the figure. Similarly, if the subject in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section (and/or plan view) illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated or described as a rectangle will, typically, have rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. It will also be appreciated by those of skill in the art that references to a structure or feature that is disposed "adjacent" another feature may have portions that overlap or underlie the adjacent feature.

As appreciated by the present inventors, when the gate insulating layer (of, for example, the '642 patent discussed above) is formed of a high-k dielectric layer, such as a hafnium-based insulating layer, degradation of the bonding characteristic between the hafnium-based insulating layer and the polysilicon gate electrode can cause the Fermi level pinning phenomenon to occur between the gate insulating layer and the polysilicon gate electrode. Accordingly, the work function of the polysilicon gate electrode may be changed so that the threshold voltage Vth of the device is increased. Moreover, the change in the work function may be more significant in the PMOS transistor region than in the NMOS region.

As further appreciated by the present inventors, it may be advantageous to form gate electrodes differently in the PMOS and NMOS transistor regions to compensate for changes in the work function of gate electrode in the PMOS transistor region where a hafnium-based gate insulating layer is utilized.

Figure 1:
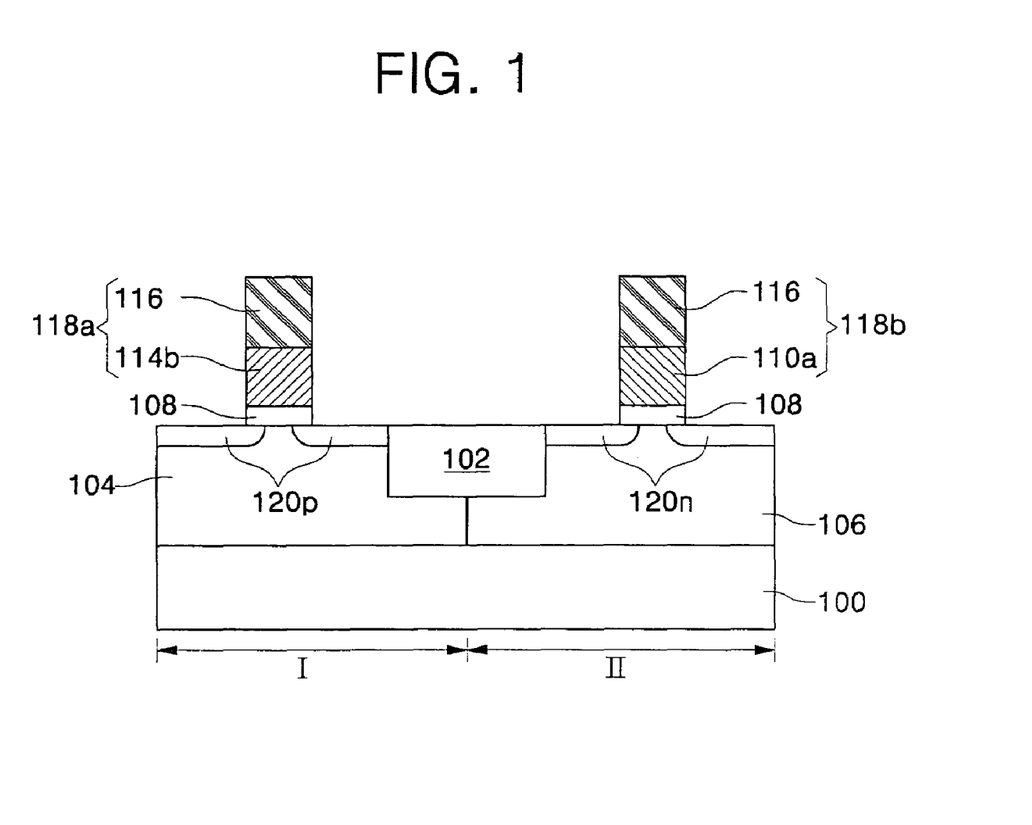
FIG. 1 is a cross-sectional view illustrating an integrated circuit including a dual-gate structure in some embodiments according to the present invention.

FIG. 1 is a cross-sectional view illustrating an integrated circuit device including a dual-gate structure in accordance with some embodiments of the present invention. Referring to FIG. 1, an isolation layer 102 is provided in a predetermined region of a semiconductor substrate 100 including a PMOS transistor region I and an NMOS transistor region II. The isolation layer 102 may be positioned in a boundary region of the PMOS transistor region I and the NMOS transistor region II. The isolation layer 102 defines an active region. An N well 104 may be provided within the semiconductor substrate 100 of the PMOS transistor region I, and a P well 106 may be provided within the semiconductor substrate 100 of the NMOS transistor region II.

A PMOS gate pattern 118a is disposed to cross over the active region of the PMOS transistor region I, and an NMOS gate pattern 118b is disposed to cross over the active region of the NMOS transistor region II. The PMOS gate pattern 118a and the NMOS gate pattern 118b are insulated from the respective active regions by a gate insulating layer 108. That is, the gate insulating layer 108 is interposed between each of the gate patterns 118a and 118b and the active regions. The gate insulating layer 108 may be a high-k dielectric layer containing hafnium. For example, in some embodiments according to the invention, the gate insulating layer 108 may be $HfO_2$, HfSiO, HfON, and/or HfSiON.

The PMOS gate pattern 118a includes a metal silicide pattern 114b in direct contact with the gate insulating layer 108 within the PMOS transistor region I. In some embodiments according to the invention, the metal silicide pattern 114b may be a cobalt silicide layer, a nickel silicide layer, a hafnium silicide layer, a tungsten silicide layer, and/or a tantalum silicide layer. In addition, the NMOS gate pattern 118b may include a polysilicon pattern 110a which is deposited on the gate insulating layer 108 within the NMOS transistor region II. In addition, each of the gate patterns 118a and 118b may further include an upper metal layer 116. In this case, the upper metal layer 116 of the PMOS gate pattern 118a is on the metal silicide pattern 114b, and the upper metal layer 116 of the NMOS gate pattern 118b is on the polysilicon pattern 110a. In some embodiments according to the invention, the upper metal layer 116 may be a cobalt layer, a nickel layer, a hafnium layer, a tungsten layer, and/or tantalum layer.

P-type source and drain regions 120p are provided at both sides of a channel region below the PMOS gate pattern 118a. In addition, N-type source and drain regions 120n are provided at both sides of a channel region below the NMOS gate pattern 118b.

As described above, in some embodiments according to the invention, a metal silicide pattern included in a gate electrode is in direct contact with a gate insulating layer in a PMOS transistor region, and a polysilicon pattern included in a gate electrode is in direct contact with the gate insulating layer in an NMOS transistor region.

Figure 2A:
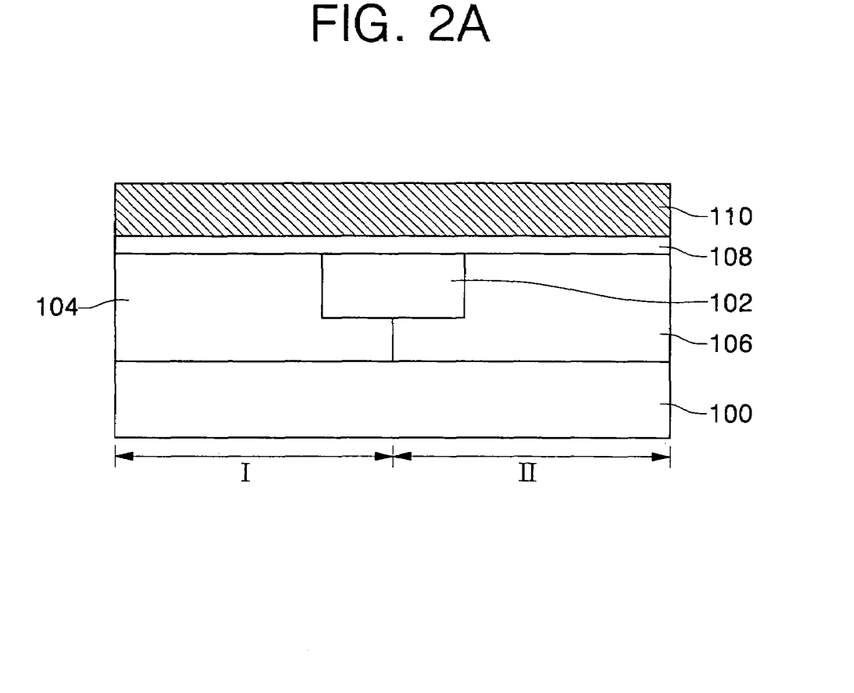
FIGS. 2A to 2G are cross-sectional views illustrating forming an integrated circuit including a dual-gate structure in some embodiments according to the present invention.

FIGS. 2A to 2G are cross-sectional views illustrating forming an integrated circuit including a dual-gate structure in some embodiments according to the present invention. Referring to FIG. 2A, a semiconductor substrate 100 having a PMOS transistor region I and an NMOS transistor region II is prepared. An isolation layer 102 is formed in a predetermined region of the semiconductor substrate 100 to define active regions within the PMOS transistor region I and the NMOS transistor region II. The isolation layer 102 may be formed using any trench isolation technique. The isolation layer 102 may be formed at a boundary region between the PMOS transistor region I and the NMOS transistor region II.

Ion implantations may be applied to the semiconductor substrate 100 to form an N well 104 and a P well 106 within the PMOS transistor region I and the NMOS transistor region II, respectively. A gate insulating layer 108 is formed on the substrate including the wells 104 and 106. In some embodiments according to the invention, the gate insulating layer 108 is formed of a material having a high-k dielectric constant. For example, the gate insulating layer 108 may be formed of an insulating layer containing hafnium, such as $HfO_2$, HfSiO, HfON, and HfSiON. A polysilicon layer 110 is formed on the substrate having the gate insulating layer 108.

Figure 2B:
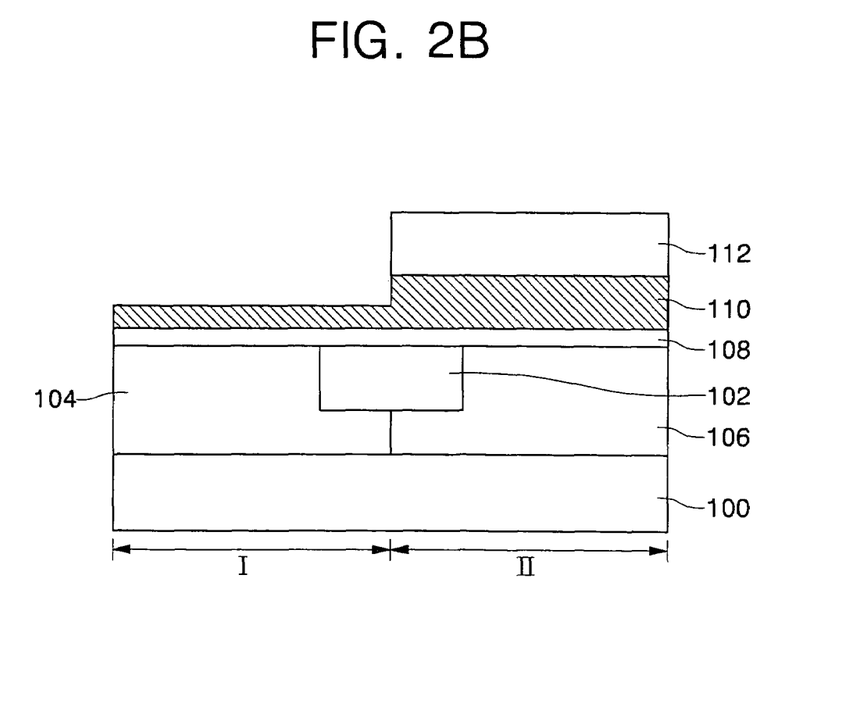

Referring to FIG. 2B, a mask layer is formed on the polysilicon layer 110. In some embodiments according to the invention, the mask layer is an insulating layer such as a silicon oxide layer or a silicon nitride layer. The mask layer is patterned to form a mask pattern 112 which exposes the polysilicon layer 110 on the PMOS transistor region I whereas a portion of the mask pattern 112 remains to cover the polysilicon layer 110 on NMOS transistor region II. The polysilicon layer 110 within the PMOS transistor region I is partially etched using the mask pattern 112 as an etch mask. As a result, a recessed polysilicon layer is formed within the PMOS transistor region I having a thickness less than an initial thickness of the polysilicon layer 110. Furthermore, the thickness of the recessed polysilicon layer is less than the portion of the polysilicon layer 110 on NMOS transistor region II beneath the mask pattern 112

Figure 2C:
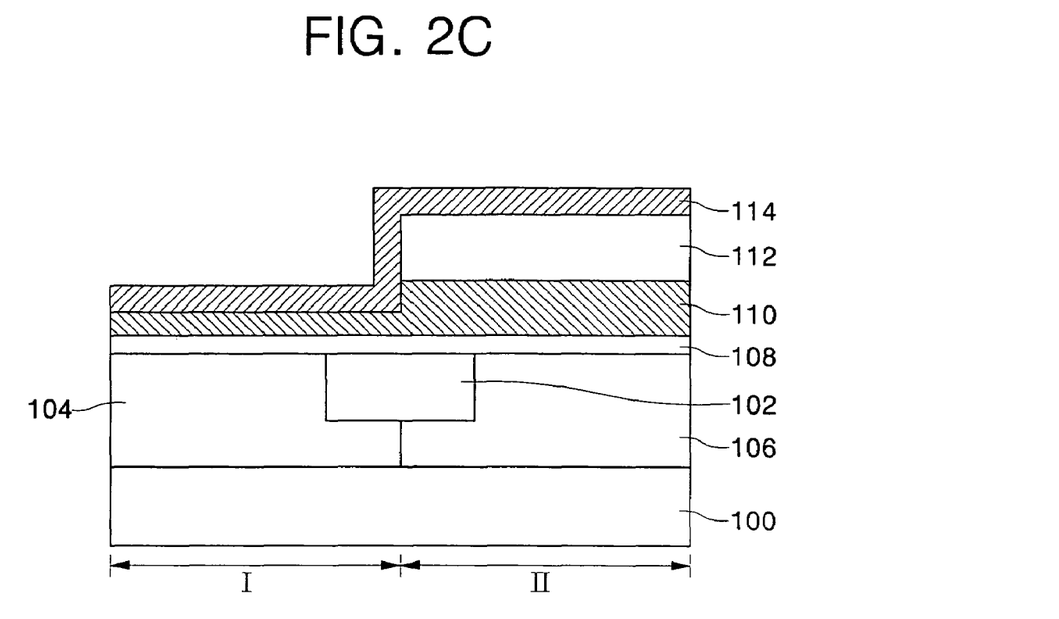

Referring to FIG. 2C, a lower metal layer 114 is formed on the substrate where the polysilicon layer 110 is recessed. The lower metal layer 114 may be formed by any one of an atomic layer deposition (ALD) technique, a chemical vapor deposition (CVD) technique, and a plasma enhanced atomic layer deposition (PEALD) technique. The lower metal layer 114 may be formed of any one of a cobalt layer, a nickel layer, a hafnium layer, a tungsten layer, and a tantalum layer.

Figure 2D:
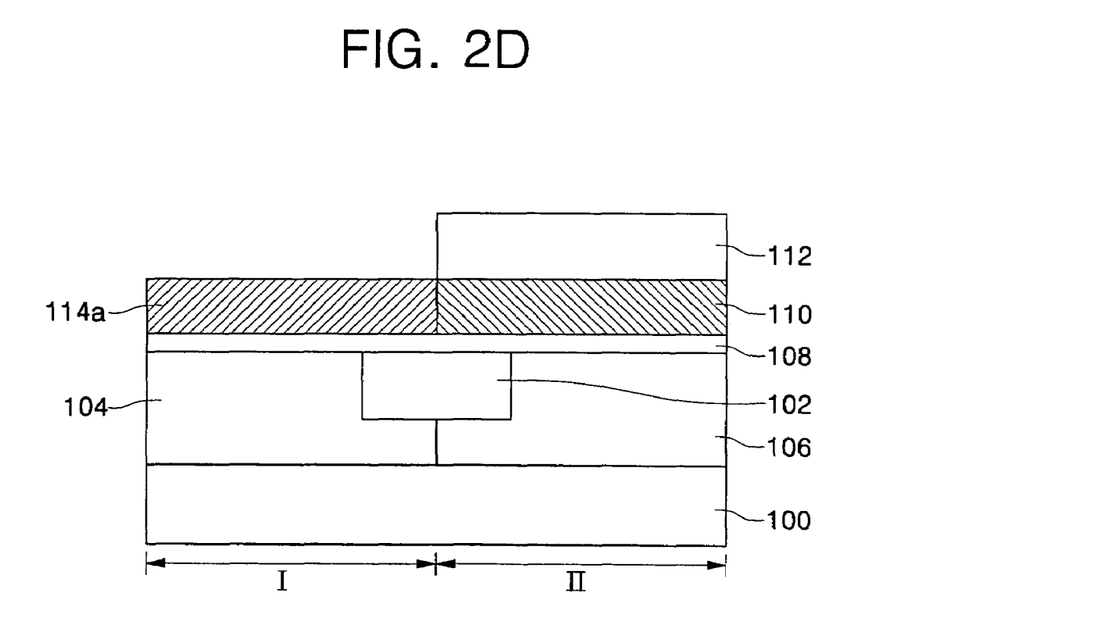

Referring to FIG. 2D, the substrate having the lower metal layer 114 is annealed to form a metal silicide layer 114a which is in direct contact with the gate insulating layer 108 within the PMOS transistor region I. An unreacted lower metal layer 114 remaining on the mask pattern 112 is selectively removed using a wet etchant.

Figure 2E:
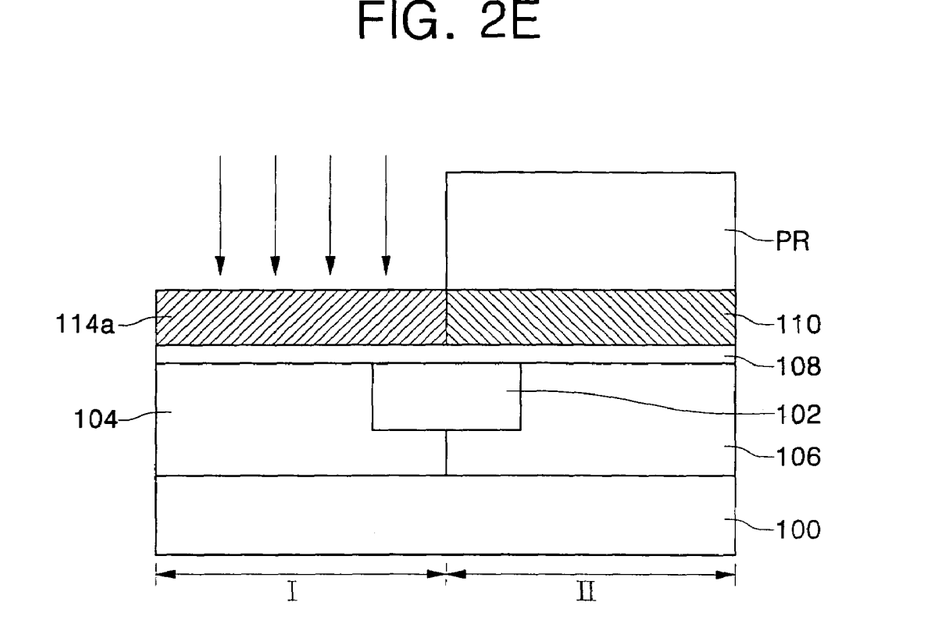

Referring to FIG. 2E, the mask pattern 112 is removed and a planarization process may be further carried out. A photoresist layer is formed on the semiconductor substrate where the mask pattern 112 is removed. The photoresist layer is patterned by a photolithography process to form a photoresist pattern PR that exposes the metal silicide layer 114a on the PMOS transistor region I. As shown in FIG. 2E, impurity ions may be implanted into the metal silicide layer 114a using the photoresist pattern PR as an ion implantation mask to adjust the work function of the metal silicide layer 114a for use as a gate electrode. In some embodiments according to the invention, the impurity ions are implanted prior to removal of the mask pattern 112 so that the mask pattern 112 may act as an ion implantation mask.

Figure 2F:
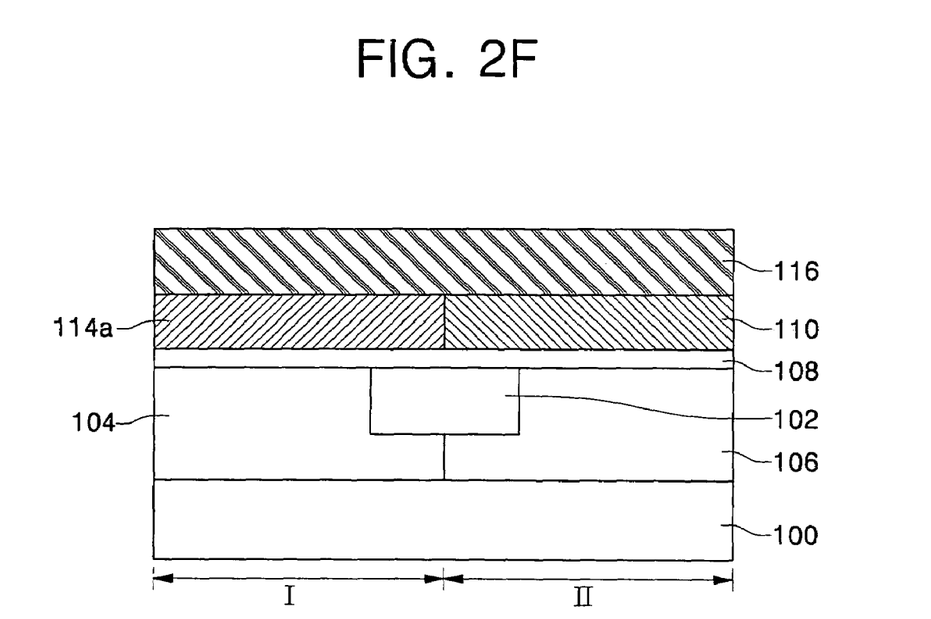

Referring to FIG. 2F, the photoresist pattern PR is removed. An upper metal layer 116 may be formed on the substrate where the photoresist pattern PR is removed. The upper metal layer 116 may be a cobalt layer, a nickel layer, a hafnium layer, a tungsten layer, and/or a tantalum layer.

Figure 2G:
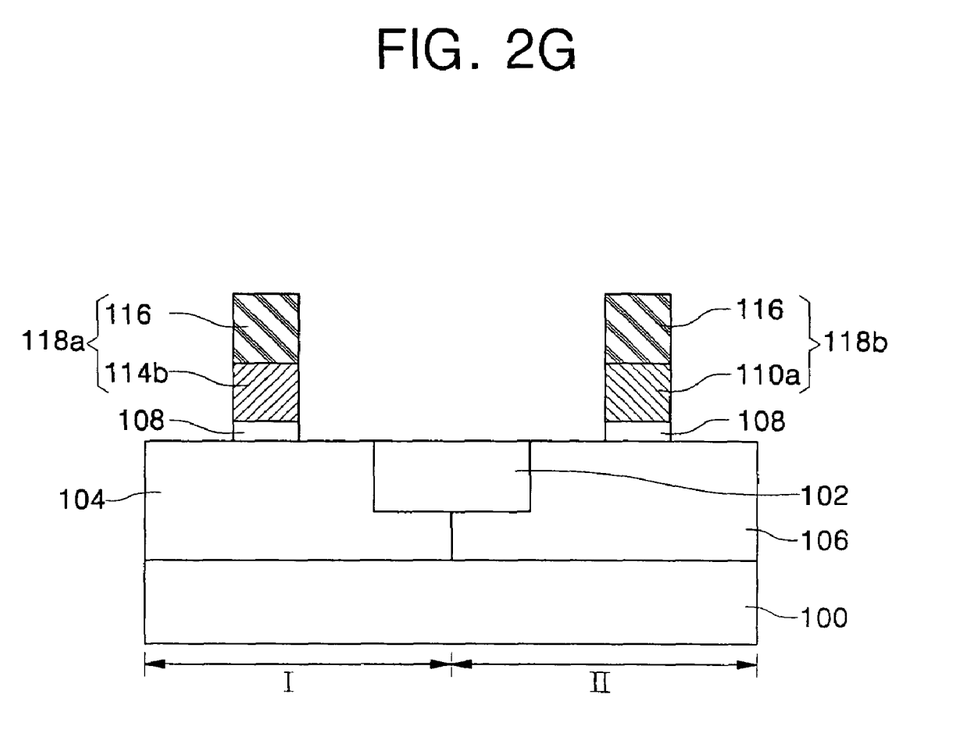

Referring to FIG. 2G, the upper metal layer 116, the metal silicide layer 114a, and the polysilicon layer 110 are patterned by photolithography and etching to form a PMOS gate pattern 118a and an NMOS gate pattern 118b which cross over respective active regions within the PMOS transistor region I and an active region within the NMOS transistor region II. In some embodiments according to the invention, the PMOS gate pattern 118a includes a metal silicide pattern 114b in direct contact with the gate insulating layer 108, and the upper metal layer 116 deposited on the metal suicide pattern 114b, and the NMOS gate pattern 118b may include a polysilicon pattern 110a (which may or may not be in direct contact with the gate insulating layer 108) and the upper metal layer 116 deposited on the polysilicon pattern 110a.

According to the embodiments of the present invention as mentioned above, the metal silicide gate is formed in the PMOS transistor region, and the polysilicon gate is formed in the NMOS transistor region. Impurity ions may be selectively implanted into the metal silicide gate of the PMOS transistor region to adjust the work function of the metal silicide gate. Accordingly, dual gates having different structures may be formed on a chip including NMOS and PMOS regions. Moreover, the work functions of the NMOS gate pattern and the PMOS gate pattern may be customized by selective implants.

Embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed:

1. A method of forming transistor gate structures in an integrated circuit device comprising:
   forming a high-k gate insulating layer on a substrate including a first region to include PMOS transistors and a second region to include NMOS transistors;
   forming a polysilicon gate layer on the high-k gate insulating layer in the first and second regions;
   forming a metal silicide gate layer directly on the high-k gate insulating layer in the first region and avoiding forming the metal-silicide in the second region; and
   implanting ions into the metal silicide gate layer to provide an ion implanted adjusted work function gate layer.

2. A method according to claim 1 wherein forming a polysilicon gate layer comprises forming the polysilicon gate layer directly on the high-k gate insulating layer.

3. A method according to claim 1 wherein forming a metal silicide gate layer comprises:
   forming a polysilicon layer directly on the high-k gate insulating layer;
   forming a lower metal layer on the polysilicon gate layer in the first region; and
   annealing the lower metal layer and the polysilicon to form the metal silicide gate layer.

4. A method according to claim 3 wherein the lower metal layer comprises a cobalt layer, a nickel layer, a hafnium layer, a tungsten layer, and/or a tantalum layer.

5. A method according to claim 3 further comprising:
   forming the polysilicon gate layer directly on the high-k gate insulating layer in the first and second regions;
   forming a mask pattern on the polysilicon gate layer that covers the polysilicon gate layer in the second region and exposes the polysilicon gate layer in the first region; and
   recessing the polysilicon gate layer in the first region to form a reduced thickness polysilicon gate layer that is thinner than a thickness of the polysilicon gate layer covered by the mask pattern.

6. A method according to claim 5 further comprising:
   forming the lower metal layer on the reduced thickness polysilicon gate layer and on the mask pattern;
   annealing the lower metal layer on the reduced thickness polysilicon gate layer to form the metal silicide gate layer in the first region; and
   removing any unreacted portion of the lower metal layer.

7. A method of forming transistor gate structures in an integrated circuit device comprising:
   forming a high-k gate insulating layer on a substrate including a first region to include PMOS transistors and a second region to include NMOS transistors;
   forming a polysilicon gate layer on the high-k gate insulating layer in the first and second regions;
   forming a metal silicide gate layer directly on the high-k gate insulating layer in the first region and avoiding forming the metal-silicide in the second region wherein forming a metal silicide gate layer comprises:
   forming a polysilicon layer directly on the high-k gate insulating layer;
   forming a lower metal layer on the polysilicon gate layer in the first region;
   annealing the lower metal layer and the polysilicon to form the metal silicide gate layer, the method further comprising:
   forming the polysilicon gate layer directly on the high-k gate insulating layer in the first and second regions;
   forming a mask pattern on the polysilicon gate layer that covers the polysilicon gate layer in the second region and exposes the polysilicon gate layer in the first region; and
   recessing the polysilicon gate layer in the first region to form a reduced thickness polysilicon gate layer that is thinner than a thickness of the polysilicon gate layer covered by the mask pattern, the method further comprising:
   forming the lower metal layer on the reduced thickness polysilicon gate layer and on the mask pattern;
   annealing the lower metal layer on the reduced thickness polysilicon gate layer to form the metal silicide gate layer in the first region;
   removing any unreacted portion of the lower metal layer, the method further comprising:
   removing the mask pattern from polysilicon gate layer in the second region;
   planarizing the metal silicide gate layer and the polysilicon gate layer;
   forming a photoresist pattern on the polysilicon gate layer in the second region; and
   implanting ions into the metal silicide gate layer using the photoresist as a mask to adjust a work function associated with the metal silicide gate layer pattern.

8. A method according to claim 7 further comprising:
   removing the photoresist pattern;
   forming an upper metal layer on the metal silicide gate layer and on the polysilicon gate layer; and
   patterning the upper metal layer to form a first gate structure of a PMOS transistor in the first region including the metal silicide gate layer directly on the high-k gate insulating layer and to form a second gate structure of an NMOS transistor in the second region including the polysilicon gate layer directly on the high-k gate insulating layer.

9. A method according to claim 8 wherein the upper metal layer comprises a cobalt layer, a nickel layer, a hafnium layer, a tungsten layer, and/or a tantalum layer.

10. A method according to claim 1 wherein the high-k gate insulating layer comprises $HfO_2$, HfSiO, HfON, and/or HfSiON.

11. A method of forming transistor gate structures in an integrated circuit device comprising:
    forming a high-k gate insulating layer on a substrate including on a first region to include PMOS transistors and on a second region to include NMOS transistors;
    forming a polysilicon gate layer directly on the high-k gate insulating layer in the second region;
    forming a mask pattern on the polysilicon gate layer that covers the polysilicon gate layer in the second region and exposes the polysilicon gate layer in the first region;
    recessing the polysilicon gate layer in the first region to form a reduced thickness polysilicon gate layer that is thinner than a thickness of the polysilicon gate layer covered by the mask pattern;
    forming a lower metal layer on the recessed polysilicon gate layer in the first region and on the mask pattern in the second region;
    annealing the polysilicon gate layer directly on the high-k gate insulating layer to react with the lower metal layer to form a metal silicide gate layer;
    removing any unreacted portion of the lower metal layer from the first and second regions;
    removing the mask pattern from polysilicon gate layer in the second region;

planarizing the metal silicide gate layer and the polysilicon gate layer;

forming a photoresist pattern on the polysilicon gate layer in the second region;

implanting ions into the metal silicide gate layer using the photoresist pattern as a mask to adjust a work function associated with the metal silicide gate layer;

removing the photoresist pattern;

forming an upper metal layer on the metal silicide gate layer and on the polysilicon gate layer; and patterning the upper metal layer to form a first gate structure of a PMOS transistor in the first region including the metal silicide gate layer directly on the high-k gate insulating layer and to form a second gate structure of an NMOS transistor in the second region including the polysilicon gate layer directly on the high-k gate insulating layer.

12. A method according to claim 11 wherein the lower metal layer comprises a cobalt layer, a nickel layer, a hafnium layer, a tungsten layer, and/or a tantalum layer.

13. A method according to claim 11 wherein the upper metal layer comprises a cobalt layer, a nickel layer, a hafnium layer, a tungsten layer, and/or a tantalum layer.

14. A method according to claim 11 wherein the gate insulating layer comprises $HfO_2$, HfSiO, HfON, and/or HfSiON.

15. An integrated circuit with an NMOS region and a PMOS region comprising:

a high-k gate insulating layer on a substrate including on a first region to include PMOS transistors and on a second region to include NMOS transistors;

a polysilicon gate layer directly on the high-k gate insulating layer in the second region; and a metal silicide gate layer directly on the high-k gate insulating layer in the first region wherein the metal silicide gate layer comprises an ion implanted adjusted work function gate layer.

16. An integrated circuit device according to claim 15 wherein the metal silicide gate layer comprises a cobalt silicide layer, a nickel silicide layer, a hafnium silicide layer, a tungsten silicide layer, and/or a tantalum silicide layer.

17. An integrated circuit according to claim 15 wherein the high-k gate insulating layer comprises $HfO_2$, HfSiO, HfON, and/or HfSiON.

18. An integrated circuit device according to claim 15 wherein each of the transistors further includes an upper metal layer, the upper metal layer of the NMOS transistors being on the polysilicon gate layer and the upper metal layer of the PMOS transistors being on the metal silicide gate layer.

19. An integrated circuit device according to claim 18 wherein the upper metal layer comprises a cobalt layer, a nickel layer, a hafnium layer, a tungsten layer, and/or a tantalum layer.

* * * * *